(12) United States Patent
Bussink et al.

(10) Patent No.: US 8,514,368 B2
(45) Date of Patent: Aug. 20, 2013

(54) LITHOGRAPHIC APPARATUS, METHOD FOR LEVELLING AN OBJECT, AND LITHOGRAPHIC PROJECTION METHOD

(75) Inventors: Peter Gerhardus Wilhelmus Bussink, 's-Gravenhage (NL); Anastasius Jacobus Anicetus Bruinsma, Delft (NL); Hendricus Johannes Maria Meijer, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 313 days.

(21) Appl. No.: 12/809,730

(22) PCT Filed: Dec. 22, 2008

(86) PCT No.: PCT/NL2008/050842
§ 371 (c)(1),
(2), (4) Date: Jun. 21, 2010

(87) PCT Pub. No.: WO2009/082226
PCT Pub. Date: Jul. 2, 2009

(65) Prior Publication Data
US 2010/0265484 A1    Oct. 21, 2010

Related U.S. Application Data

(60) Provisional application No. 61/008,588, filed on Dec. 21, 2007.

(51) Int. Cl.
*G03B 27/42* (2006.01)
*G03B 27/54* (2006.01)

(52) U.S. Cl.
USPC ............................................. 355/53; 355/67

(58) Field of Classification Search
USPC .................. 355/52, 53, 55, 67, 71; 250/548; 356/399–401
See application file for complete search history.

(56) References Cited

U.S. PATENT DOCUMENTS

| | | | | |
|---|---|---|---|---|
| 5,502,311 | A * | 3/1996 | Imai et al. | 250/548 |
| 5,801,835 | A | 9/1998 | Mizutani et al. | 356/614 |
| 6,549,271 | B2 * | 4/2003 | Yasuda et al. | 355/55 |
| 7,160,654 | B2 * | 1/2007 | Tsai | 430/22 |
| 7,239,371 | B2 * | 7/2007 | Liegl et al. | 355/55 |

(Continued)

FOREIGN PATENT DOCUMENTS

| | | |
|---|---|---|
| JP | 2004-221253 | 8/2004 |
| JP | 2006-261419 | 9/2006 |
| JP | 2007-095767 | 4/2007 |
| WO | 2006/078025 | 7/2006 |

OTHER PUBLICATIONS

Notification Concerning Transmittal of International Preliminary Report on Patentability mailed Jul. 1, 2010 in corresponding International Application No. PCT/NL2008/050842.
International Search Report as issued for PCT/NL2008/050842, dated Apr. 21, 2009.

(Continued)

*Primary Examiner* — Hung Henry Nguyen
(74) *Attorney, Agent, or Firm* — Pillsbury Winthrop Shaw Pittman LLP (57) ABSTRACT

A lithographic apparatus configured to project a patterned radiation beam onto a substrate. The apparatus includes a support configured to hold a patterned object, and a measurement system configured to detect orientations and/or densities of user area structures that are present on a user area of the patterned object.

22 Claims, 3 Drawing Sheets

(56) References Cited

U.S. PATENT DOCUMENTS

| | | | |
|---|---|---|---|
| 7,446,885 B2 * | 11/2008 | Zabolitzky et al. | 356/601 |
| 2005/0161615 A1 | 7/2005 | Maeda et al. | 250/491.1 |
| 2006/0076488 A1 | 4/2006 | Ina | 250/309 |
| 2006/0273267 A1 * | 12/2006 | Maeda | 250/548 |
| 2007/0085991 A1 | 4/2007 | Liegl et al. | 355/55 |

OTHER PUBLICATIONS

Kahlenberg, et al., "Best focus determination: bridging the gap between optical and physical topography", Optical Microlithography XX, edited by Donis G. Flagello, Proceedings of SPIE, vol. 6520, 65200Z, 2007, pp. 65200Z-1-65200Z-8 (8 pages).

Japanese Office Action mailed Jan. 7, 2013 in corresponding Japanese Patent Application No. 2010-539339.

\* cited by examiner

LITHOGRAPHIC APPARATUS, METHOD FOR LEVELLING AN OBJECT, AND LITHOGRAPHIC PROJECTION METHOD

CROSS-REFERENCE TO RELATED APPLICATIONS

This application is the U.S. National Phase application of International Application No. PCT/NL2008/050842, filed Dec. 22, 2008, which claims priority from U.S. Provisional Patent Application No. 61/008,588, filed Dec. 21, 2007, the content of which is incorporated herein by reference in its entirety.

FIELD

The present invention relates to a lithographic apparatus, a method for levelling an object, and a lithographic projection method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies, i.e. substrate user areas) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

It is known to focus the reticle with respect to the projection system of the lithography apparatus. Currently, a reticle level sensor is used for this purpose. The known sensor optically measures the reticle height using two lanes, which lanes are located outside a customer area part of the reticle. In a lithographic system having a non-telecentric projection system, a precise positioning of the reticle in a Z-direction (a direction that is normal to a patterned reticle surface) is desired, to prevent overlay errors.

SUMMARY

It is desirable to provide an improved lithographic apparatus and method. Particularly, it is desirable to provide a very accurate positioning of a patterned object.

According to an embodiment of the invention, there is provided a lithographic apparatus that is configured to project a patterned radiation beam onto a substrate. The apparatus includes a support configured to hold a patterned object, and a measurement system configured to detect orientations and/or densities of user area structures that are present on a user area of the patterned object.

According to an embodiment, there is provided a lithographic apparatus that is configured to project a patterned radiation beam onto a substrate. The apparatus includes a support configured to hold a patterned object, the patterned object having a patterned user area, and a levelling information system configured to provide levelling information that is based on orientations and/or densities of user area structures present on the user area of the patterned object. The apparatus also includes a levelling system configured to receive the levelling information from the levelling information system, and to use the received levelling information for levelling the patterned object.

According to an embodiment, there is provided a method for levelling a patterned object. The method includes detecting an orientation and/or density of one or more user area structures present on a user area of the object, generating levelling information based on detected orientation and/or density of the structures, and levelling the patterned object by utilizing the levelling information.

According to an embodiment, there is provided a lithographic projection method that includes providing a radiation beam of radiation having a first wavelength, and providing a patterning device containing a user area having a pattern of structures. The structures have a first reflectivity for the radiation and user area parts extending outside the structures have a second reflectivity for the radiation. The second reflectivity is different from the first reflectivity. The method also includes directing the radiation beam onto the user area of the patterning device to impart the pattern of the user area to the radiation beam, projecting the patterned radiation beam onto a target portion of a substrate with a projection system, and levelling of at least one of the patterning device and the substrate with respect to the projection system, so that an object plane provided by the patterning device is projected in focus by the projection system onto the substrate. The levelling includes utilizing a predetermined relation between one or both of orientations and local densities of surface structures and the effect of those surface structure orientations and/or densities on reflection of different polarization parts of incoming radiation.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
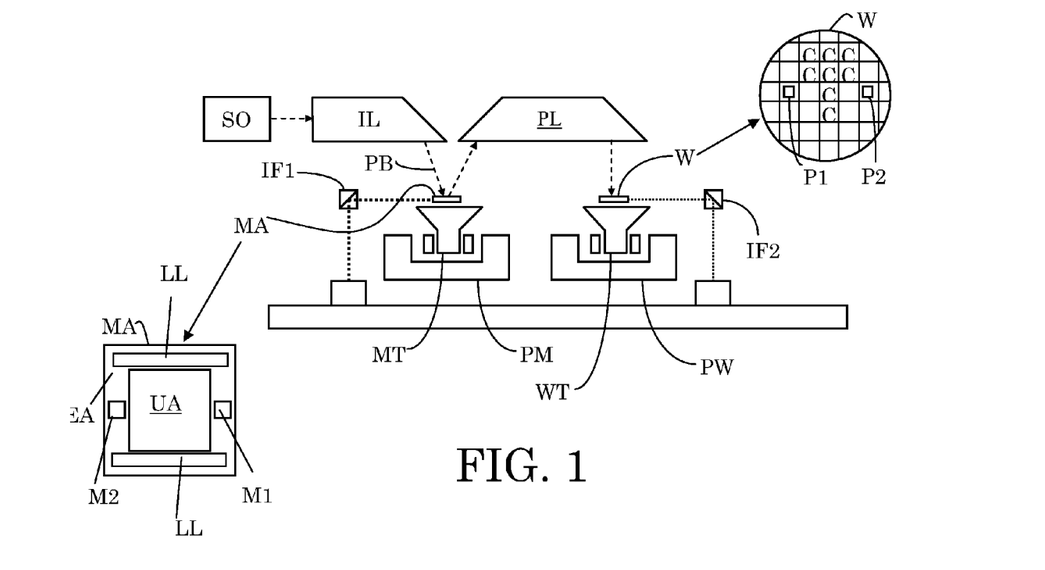
FIG. 1 depicts a lithographic apparatus according to an embodiment of the invention.

FIG. 1 schematically depicts a lithographic apparatus according to one embodiment of the invention. The apparatus is of a non-telecentric type.

The apparatus comprises an illumination system (illuminator) IL configured to condition a radiation beam PB (e.g. UV radiation, and particularly Deep Ultra Violet, or DUV, radiation), and a support structure (e.g. a mask table) MT constructed to support a patterning device (e.g. a mask) MA and connected to a first positioner PM configured to accurately position the patterning device in accordance with certain parameters. The apparatus also includes a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks. Masks are well known in lithography, and include mask types such as binary, alternating phase-shift, and attenuated phase-shift, as well as various hybrid mask types.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if desired, may be referred to as a radiation system.

The illuminator IL may comprise an adjuster for adjusting the angular intensity distribution of the radiation beam. Generally, at least the outer and/or inner radial extent (commonly referred to as s-outer and s-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam PB.

Similarly, the first positioner PM and another position sensor IF1 can be used to accurately position the mask MA with respect to the path of the radiation beam PB, e.g. after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed.

Figure 4:
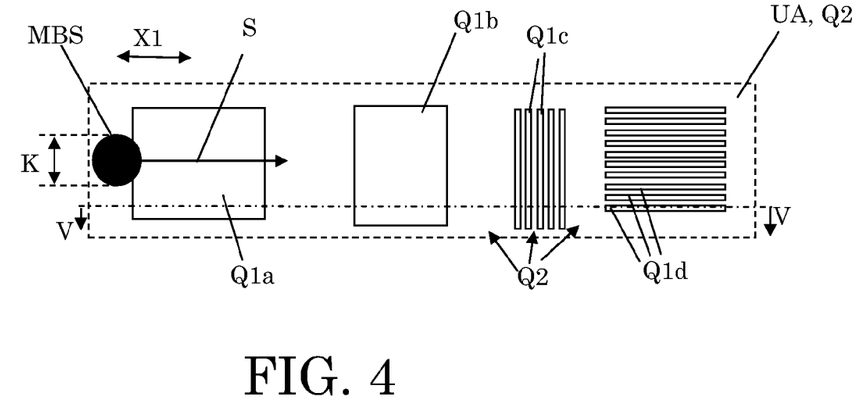
FIG. 4 schematically depicts a detail of FIG. 3, during operation of a measuring system of the apparatus of FIGS. 1 and 2.
Figure 5:
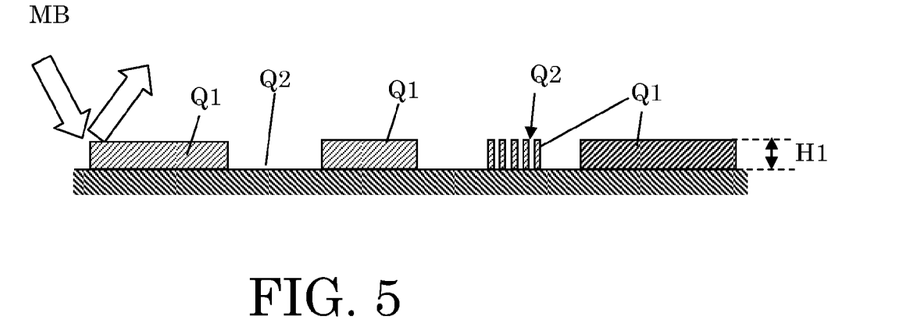
FIG. 5 is a cross-section along line V-V of FIG. 4.

FIGS. 4, 5 show a detail of part of a mask MA. As is shown in FIGS. 1, 2, 4, 5, the mask MA can comprise a mask user area UA, which area can be provided with a user defined pattern Q1, Q2. For example, the pattern Q1, Q2 may be associated with a desired circuit pattern to be formed by the apparatus on a substrate W. Particularly, the pattern can include first user area parts (also called 'pattern features') Q1 and second user area parts Q2, configured to interact differently with the incoming radiation beam PB.

For example, the first parts Q1 can be configured to reflect incoming radiation of the radiation beam PB, and the second parts Q2 can be configured to at least partly absorb incoming radiation of the radiation beam PB, or vice-versa. For example, the first parts Q1 (or alternatively the second parts) can be mirror parts, including one or more minor forming layers, such that each minor part can reflect incoming radiation of a predetermined wavelength of the radiation beam (for example EUV light). Similarly, for example, the second parts Q2 (or alternatively the first parts) can be radiation absorbing parts, including one or more absorber forming layers, such that each second part can absorb or block incoming radiation of the predetermined wavelength of the radiation beam.

In other words, the first user area parts or structures Q1 can have a first reflectivity for the radiation of the radiation beam PB, and the second user area parts or structures Q2 extending outside the first structures Q1 can have a second reflectivity for that radiation, the second reflectivity being different from (for example significantly lower than) the first reflectivity.

According to a further embodiment, the first user area parts Q1 extend or reach out of a remaining mask user area part that is defined by the second user area parts Q2. Thus, the mask user area UA can have a certain relief. For example, a height H1 of outwardly (in a Z-direction, normal to the general mask surface) protruding first pattern parts Q1 is depicted by double arrow H1 in FIG. 5. This height H1 can be in the range of about 1-1000 nm, or in the range of about 10-100 nm. According to an embodiment, all first (protruding) user area parts Q1 may have (substantially) the same height. For example, at least 99% of the first user area parts Q1 can have a predetermined height H1, or a height that is in a range of the predetermined height H1+/−0.5 nm.

In an embodiment, the height H1 of the first mask features or parts Q1 (i.e., the level of upper surfaces of the first parts Q1 with respect to the surface of the second user area parts Q2) may be known. For example, the height H1 may already be measured (for example ex-situ) using a suitable measuring device, and/or the height can be obtained from parameters used in a respective mask manufacturing process to manufacture the respective mask MA.

As shown in FIG. 4, the first and second parts Q1, Q2 may have different shapes, orientations and dimensions, when viewed in top view (herein, particularly, shapes, dimensions and orientations of the second parts Q2 depend on those of the first parts Q1, since the first parts Q1 define the second parts Q2, or vice-versa).

The surface density of the first parts (and second parts) may vary locally, i.e. for different sections of the user area UA. For example, a local surface density of the pattern structures can be the surface area of the first parts Q1 (or the second parts Q2) per overall surface area of a local user area fraction. For example a mentioned fraction of the user area UA can be a fraction having a surface area of 1 mm×1 mm, or 0.1 mm×0.1 mm, or less, or be a different fraction of the user area UA. In an embodiment, the user area fraction can have a surface area of one tenth or less of the surface area of the user area UA, for example a surface area of one hundredth or less of the surface area of the user area UA.

As a non-limiting example, the mask detail shown in FIGS. 4 and 5 includes a relatively large rectangular part Q1a, a smaller rectangular part Q1b, an array Q1c having elongated parallel features extending in parallel with a first mask direction X1, and an array Q1d of elongated parallel features extending perpendicular with respect to the first mask direction X1 (which direction is parallel to one of the edges of the mask MA). However, mask features Q1, Q2 can have many other shapes or forms, for example curved, elongated, and other shapes, such as a compound shape. Mask parts or features Q1, Q2 can extend along various directions, for example other directions than depicted in FIG. 4. Also, a first mask part can have various lengths and widths (when viewed in top view).

Mask MA and substrate W may be aligned using mask alignment marks (or markers) M1, M2 and substrate alignment marks P1, P2. In an embodiment, the marks M1, M2 are located in or provided by a marker area EA that is located outside the user area UA. In the present embodiment, the marker area EA and the user area UA are located at the same side of the mask MA (which side receives the radiation beam PB during lithographic operation, and is faced away from the mask support MT, as in FIG. 1). In an embodiment, the marker area EA encloses the user area, viewed in top view (see FIG. 3). In other words, the marker area EA may extend along a perimeter of the mask MA, and the pattern containing user area UA may be spaced-apart from the perimeter of the mask MA (as in FIG. 3). In a further embodiment, the marker area EA is also provided with a levelling pattern LL, for example a pattern including two parallel, flat radiation reflecting strips or lines LL (for example elongated rectangles), which extend along opposite sides of the user area UA (see FIGS. 1 and 3).

The apparatus may also include a levelling system configured to level the mask with respect to the projection system. The levelling system can be configured to set a Z-position of the mask MA, i.e., a position in a direction that is normal to the mask user area UA. For example, the levelling system can be configured to optically measure a mask Z-position using the two strips LL. The levelling system may be designed to focus the mask, held by the mask support structure MT, with respect to the downstream projection system PL, such that the user pattern can be projected in focus onto a substrate W held on the substrate support structure WT (see FIG. 1). For example, the levelling system can be part of the first positioner PM, and/or it can cooperate with the first positioner PM, to provide a desired Z-positioning of the mask MA (for example during an initialization phase of the apparatus, for example before the apparatus actually performs a lithographic method to project a patterned beam PB onto one or more target portions C of a substrate W). Embodiments of a highly accurate levelling system are described below, and illustrated in FIGS. 2-6.

Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the respective mask user areas.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
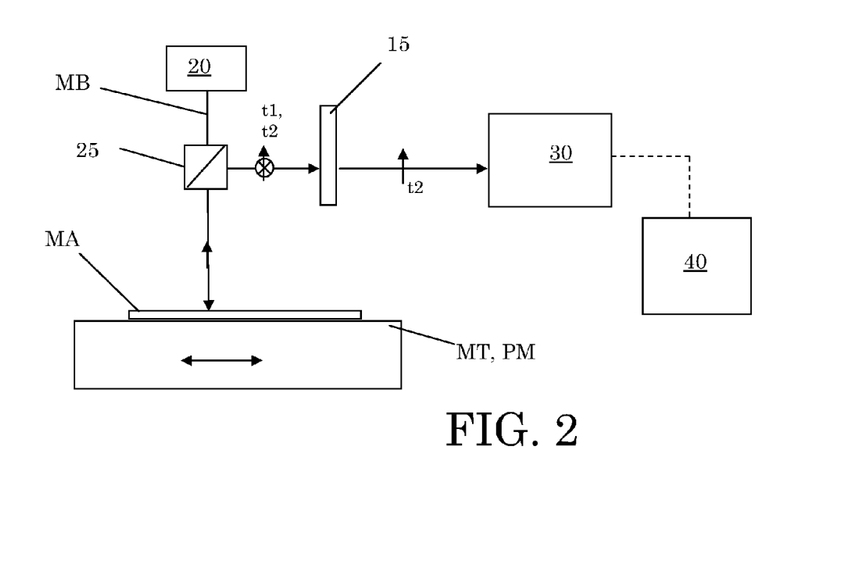
FIG. 2 depicts part of the apparatus of FIG. 1 in more detail.

FIG. 2 depicts part of a lithographic apparatus, for example the above described apparatus. The apparatus comprises a support structure configured to hold a patterned object. In the present embodiment, the support structure is the mask support structure MT, and the patterned object is the mask MA. In an embodiment, the support structure may be configured to support or hold a substrate, for example a substrate that is already partly patterned (in which case a substrate user area can have a certain relief, for example having protruding substrate parts, similar to the above described mask embodiment shown in FIGS. 4-5).

The apparatus may also comprises a measurement system configured to detect orientations and/or above-mentioned local densities of the structures Q1, Q2 present on a user area of a patterned object MA, held by the support structure. Preferably, the measurement system can detect both orientations and local densities of the structures Q1, Q2. The measurement system may be configured to detect only orientations or local densities of the structures Q1, Q2. The measurement system may be part of an above-mentioned levelling system. According to an embodiment, the measurement system may be configured to discern or determine one or more of: spatial orientations of user area structures, in a 2-dimensional plane (along a certain measuring line 45 or strip or field); angular orientations of user area structures, in the 2-dimensional plane (along a certain measuring line or strip or field); and general shapes of user area structures, in the 2-dimensional plane.

The measurement system can be configured to discern local differences of structure densities. Preferably, the measurement system is be configured to determine the surface area fraction (surface density) of the first parts Q1 (and/or the second parts Q2) for a plurality of different fractions of the user area UA.

Figure 3:
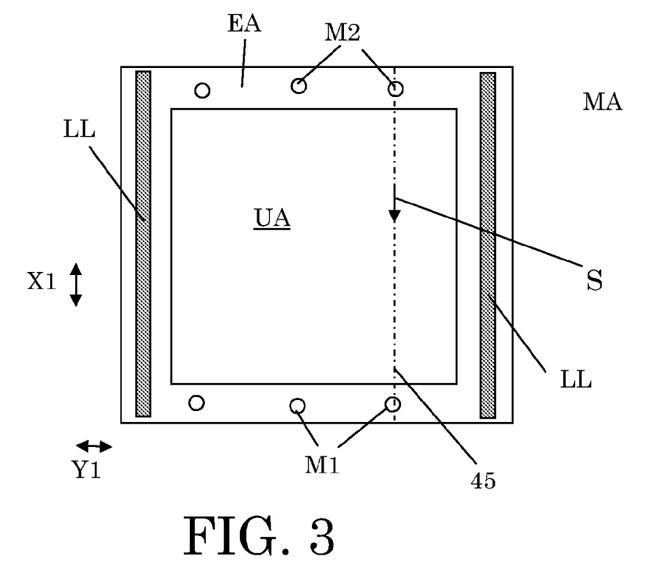
FIG. 3 depicts a top view of a patterning device of the apparatus of FIGS. 1 and 2.

In an embodiment, the measurement system may be configured to determine the orientations of user area structures with respect to two orthogonal directions X1, Y1, which two orthogonal directions X1, Y1 are both parallel to a radiation receiving surface of the patterned object. FIG. 3 indicates examples of the orthogonal directions with arrows X1, Y1. For example, a mentioned orthogonal direction X1, Y1 can be vertical direction, horizontal direction, or another direction.

In an embodiment, the measurement system may be configured to scan a measurement beam MB along at least one scanning line over the user area UA of the patterned object MA, as is indicated in the Figures. For example, the measurement beam MB can be example a laser beam, unpolarized light, a polarized light beam having a predetermined polarization, for example linear, circular or elliptical polarized, or a different type of radiation beam. In an embodiment, at least part of an above-mentioned radiation beam PB may be used as the measurement beam.

As illustrated in FIG. 2, the measurement system can be provided with a beam generator 20 (for example a laser, or another type of radiation source) configured to provide/emit the measurement beam MB. A scanning direction with respect to the user area is indicated by arrow S in FIG. 3; in this case, the scanning direction is in parallel with the first mask direction X1. For example, the beam MB can be scanned in a (predetermined) straight direction (line 45 in FIG. 3) over the user area UA. The scanning may be achieved in numerous ways, for example by movement of the mask table MT with respect to an incoming beam MB, and/or by varying a direction of propagation of the beam MB, for example using a beam deflector. The measurement beam MB can be directed normally to the surface of the patterned object (angle of incidence is 90°), or it can intersect the surface of the patterned object MA with an angle smaller than 90°.

In an embodiment, the measurement beam MB may be relatively narrow in cross/section, particularly such that a beam spot MBS on the patterned object (the beam spot is shown as a black dot MBS in FIG. 4) is relatively narrow. The beam spot MBS can have a circular (see FIG. 4) or elliptical cross-section, of a different shape. During operation, a maximum dimension K of the beam spot MBS may be about 1 cm, or about 1 mm.

The measurement system can be configured to scan the measurement beam MB over at least one straight scanning line 45 over the user area UA of the patterned object MA, as well as over at least one marker M1, M2 of the marker area EA. In FIG. 3, the system is configured to scan the measurement beam from a first marker M1 via the user area UA to an opposite second marker M1, M2, for example in parallel with the levelling lines or stripes LL. For example, the markers M1, M2 can be used by the measurement system to accurately direct the measurement beam MB along a predetermined scanning line 45.

As shown in FIG. 2, the apparatus may include a (radiation) detector 30 that is configured and arranged to receive the measurement beam MB after it has interacted with the patterned object. The detector 30 can be configured in various ways, and can include a photodetector, polarimeter, or a different type of detector.

A beam splitter 25 may be provided that is configured to redirect a downstream part of a (reflected or transmitted) measurement beam, emanating from the patterned object MA, towards the radiation detector 30. The beam splitter 25 is located in the path of a beam part propagating towards the patterned object MA (from the source 20). Thus, a compact arrangement may be obtained in which the measurement beam MB may be directed substantially normally towards the surface of the patterned object MA.

In an embodiment, there is provided a polarizing filter (polarizer) 15 configured to filter a predetermined polarization part (mode) of a (transmitted or reflected) measurement beam part, emanating from the patterned object MA. The radiation detector 30 is associated with the filter 15, to detect radiation filtered by the polarizing filter. The filter 15 may be located in the beam path between the beam splitter 25 and the detector 30. Instead of the filter and a photodetector 30, for example, the system can be provided by a polarimeter (or the filter and detector can provide such a polarimeter 15, 30).

In an embodiment, a data processor 40 configured to process data obtained by the radiation detector may be provided. The data processor can be embodied in hardware and/or software, as will be appreciated by the skilled person, and can include one or more of a controller, computer, memory, interfaces, communication means, and/or other data processing means. The data processor 40 can be, or can be part of, a lithographic apparatus controller, configured to control overall operation of the lithographic apparatus (for example, to carry out a lithographic process), or the data processor 40 can be configured to cooperate with a lithographic apparatus controller. Also, the data processor 40 can be, or can be part of, a controller configured to control the levelling of the patterned object MA.

In an embodiment, the data processor 40 can be configured to determine, calculate or estimate structure orientations (i.e., of the parts Q1, Q2) of the patterned object MA utilizing predetermined information (for example formulae, a database, predetermined empirically obtained information), which information contains a relationship between at least two predetermined structure orientations and at least two different polarization modes of a reflected measurement beam part.

In an embodiment, the data processor 40 can be configured to determine, calculate or estimate local densities (of the parts Q1, Q2) of the patterned object MA utilizing predetermined information (for example formulae, a database, predetermined empirically obtained information), which information contains a relationship between at least two predetermined structure densities and an intensity or reflection ratio of a reflected measurement beam part.

In an embodiment, a levelling information provider (or 'information generator') configured to generate levelling information utilizing the detected orientations and-or local densities of structures present on the user area of a patterned object may be provided. In such an embodiment, the levelling system may be configured to position a level of the patterned object based on the levelling information (provided by the levelling information provider). For example, according to a non-limiting embodiment, the above-mentioned data processor 40 can be provided with the levelling information provider.

In an embodiment, the system may include a data storage system, configured to process and store the orientations and-or local densities of structures present on the user area UA of a patterned object MA, detected by the measurement system, in combination with patterned object identification information. For example, in a non-limiting embodiment, the data storage system can be part of the data processor 40.

Operation of the system shown in FIGS. 1-6 includes a method for levelling the patterned object MA. In an embodiment, both orientations and local densities of a plurality of structures Q1, Q2 present on a user area of the object may be determined, to generate levelling information. The method may also include levelling the patterned object MA by utilizing the obtained levelling information.

The method may include or be part of a lithographic projection method, of providing the radiation beam PB of radiation having a first wavelength (see FIG. 1), and providing the patterning device MA containing the user area UA having the pattern of first structures Q1, the first structures Q1 having a first reflectivity for the radiation. User area parts Q2 extending outside the first structures Q1 have a second reflectivity for the radiation, the second reflectivity being different from the first reflectivity (as mentioned above). During lithography, the radiation beam PB is directed onto the user area UA of the patterning device MA to impart the pattern of the user area MA to the radiation beam PB. The patterned radiation beam PB is projected onto a target portion of a substrate W utilizing the projection system.

The lithographic method may also include levelling of at least one of the patterning device and the substrate with respect to the projection system, so that an object plane provided by the patterning device may be projected in focus by the projection system onto the substrate. In the following, levelling of the patterning device MA will be explained. In an embodiment, the levelling may be achieved utilizing a predetermined relation between surface structure orientations and/or local densities and the effect of those surface structure orientations and/or densities on reflection of incoming radiation.

The source 20 may emit a measurement beam MB via the beam splitter 25 towards the patterned object MA. Part of the beam that is being reflected by the object MA towards the beam splitter 25 may be redirected by the beam splitter to the detector 30 (via the optional filter 15). The skilled person will appreciate that the schematically depicted system can be modified in different ways, and can include various (other) optical elements (for example mirrors, lenses, filters) to direct at least part of the measurement beam MB along a desired path from a beam source via the patterned object towards a detector.

The method can include illuminating at least part of the object MA with the measuring beam MB such that the beam optically interacts with the structures Q1, Q2. Part of the measuring beam MB emanating from the object MA (i.e., a reflected part) can be utilized to discern or determine one or more of: spatial orientations of user area structures, angular orientations of user area structures, general shapes of user area structures, optical properties, and/or the local surface density of the structures. As is indicated in FIGS. 3-5, the measuring beam MB may be scanned along a predetermined scanning line 45 over the object MA to illuminate a measuring field of the user area of the patterned object. The measuring field contains a pattern of structures Q1, Q2 having certain spatial orientations, angular orientations general shapes, densities, respectively, with respect to the scanning line 45 (see FIGS. 4-5).

During operation of the present embodiment, the measurement beam MB is being scanned along at least one scanning line 45 over the user area UA of the patterned object MA as well as over markers M1, M2 of the marker area EA located outside the user area UA of the object MA. The markers M1, M2 may provide way-points to accurately and reproducibly position and direct the scanning measurement beam MB over a predetermined path over the patterned object MA. The markers M1, M2 may also be used in their more typical role, e.g., to position the object MA, as mentioned above.

As is shown in FIGS. 4-5, during scanning along the line 45, the measurement beam MB will encounter the different structures Q1 (some indicated by Q1$a$, Q1$b$, Q1$c$, Q1$d$ in FIG. 4). The different structures Q1 have different local densities, and different orientations, and therefore may interact differently with the incoming measurement beam MB. For example, user area sections having low density of reflecting first parts Q1 will provide a low reflectivity, and thus a low intensity of a reflected part of the measurement beam MB), and sections having a high density of reflective parts Q1 will provide a high reflection reflectivity, resulting in a high intensity of a reflected part of the measurement beam MB.

Figure 6:
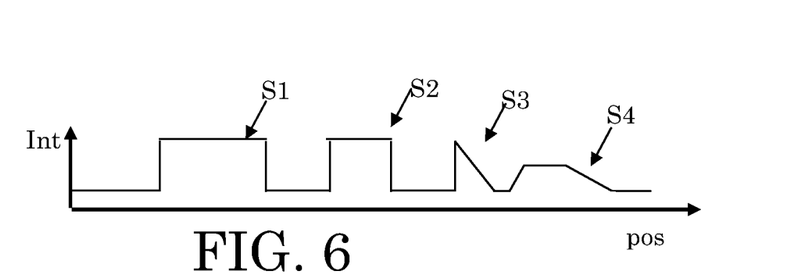
FIG. 6 schematically depicts part of a sensor signal.

FIG. 6 shows an example of a sensor signal of the radiation sensor 30 (particularly indication sensor signal intensity Int versus scanning position pos), that can result from a measurement of the reflected measurement beam part after scanning of the section shown in FIGS. 4-5. Relatively large first structures Q1$a$, Q1$b$ may provide well-defined reflection of the measurement beam MB (resulting in well defined measurement signal parts s1, s2), however, the structures Q1$c$, Q1$d$ having relatively small features (i.e., significantly smaller than the beam K spot size) may provide blurred measurement signals s3, s4.

A resulting measurement signal relating to scanning the measurement beam MB along the scanning line 45 can be stored and processed by the data processor 40. In an embodiment, the measurement beam MB can be scanned over the patterned object MA along a plurality of different scanning lines (for example different parallel scanning lines), resulting in a plurality of scan data.

The data processor 40 can then determine (for example calculate or estimate) the local densities (of the parts Q1, Q2) of the actual patterned object MA, utilizing the predetermined information (for example formulae, a database, predetermined empirically obtained information), which information contains a relationship or correlation between different predetermined structure densities (than might be present) and respective intensities (or reflection ratios) of the reflected measurement beam. The actual comparison of sensor data with predetermined information can be achieved in different ways, as will be appreciated by the skilled person. Herein, particularly, since an upper surface of the pattern of structures Q1 extends over a predetermined level (i.e. height H1) above a remaining surface part Q2 of the user area, the predetermined level H1 can also be used to provide an accurate pattern height map from the determined the local densities of the surface structure.

Detected local densities of structures, present on the user area of the patterned object MA and detected by the measurement system, may be stored, for example in combination with patterned object identification information. For example, the identification information can be one or more of a name, number, address, code, proprietor related information, data, and/or other information.

The data processor 40 can provide accurate levelling information, based on the detected density of the structures present on the user area of the patterned object MA. Preferably, the levelling information is stored, for example in combination with above-mentioned patterned object identification information.

Particularly, the levelling information can be information to correct for certain errors of levelling system height measurements, particularly in the case where the levelling system is configured to determine a level (for example a Z-position) of at least part of the user area UA. For example, the levelling information can include a determined or estimated, relatively accurate height map (i.e. height profile) of features Q1, Q2 detected in the above-manner by the measurement system. Besides, the levelling information can be based on such a height map/profile, and/or the levelling information can include an average surface level of upper surfaces of the first parts Q1.

For example, in an embodiment, the patterned object MA may be deformed (for example warped or curved) when located on its support MT, such that the first pattern parts Q1 no not extend along a straight plane. In that case, the levelling information can relate to the deformation of the patterned object MA. For example, the levelling information can include patterned object deformation information (for example a type or warping or curvature of the object MA), and/or data including detected height positions of the upper surfaces of the first parts Q1 (which height positions indicate the deformation of the object MA).

In a prior art lithographic system, a levelling system only measured well defined (usually standardized) lanes LL outside the user area. In the prior art system, the controller of the lithographic apparatus did not know the precise pattern configuration of the user area pattern. In the system according to an embodiment of the present invention, accurate leveling information concerning the user area UA is also available, so that leveling can be achieved directly onto the user area UA. For example, based on the above-mentioned leveling information, the leveling system can level the patterned object MA very accurately. For example, the leveling system can now take into account any deformation or warping of the user area UA, using the leveling information provided by the measurement system. Herein, leveling can include various ways to adjust the level (for example Z-position) of the patterned object, for example adjusting the support MT of the object MA, adjusting one or more parts of the projection system of the lithographic apparatus, adjusting the level and/or position of other components of the system, and or different ways of providing a desired leveling. The leveling may include setting a Z-position of the patterned object to an average height of the pattern Q1. As is mentioned above, the leveling is particularly aimed at the projection system projecting the lithographic projection beam PB, emanating from the patterning device MA, in focus onto the substrate W.

Orientations of the structures Q1, Q2 may be detected or estimated by the measurement system, to provide a more accurate levelling information. To this aim, for example, a filter 15 can filter a predetermined polarization part (mode) of the (transmitted or reflected) measuring beam part, emanating from the patterned object MA, after which the detector 30 detects the filtered radiation. This is indicated in FIG. 3, where two orthogonal polarization modes t1, t2 before the filter 15 are indicated by a cross-and-circle (i.e. a mode t1 that is normal with respect to the plane of the drawing) and an upstanding arrow (i.e. a polarization mode t2 in the plane of the drawing), wherein only the second mode t2 is being transmitted by the filter 15 (in other words, in the depicted configuration, the filter 15 blocks the first polarization mode t1 of the reflected measurement beam part).

Different structure orientations can interact with different polarization modes in a different manner. For example, the parallel structures Q1c extending parallel with respect to the scanning line 45 can reflect the two polarization modes with different reflection ratios. Similarly, the parallel structures Q1d extending perpendicular with respect to the scanning line 45 can reflect the two polarization modes in a different manner. The relationships between reflection of certain polarization modes and certain types of structure orientations can already be predefined, for example via calculations, estimations, empirically, and can be stored (for example to be used by the data processor 40). The filter 15 or an above-mentioned polarimeter may be adjustable, so that the measurement of beam polarization can be performed for various polarisation modes t1, t2. As an example, the filter 15 can be adjusted or replaced, such that the measurement is also performed for the first mode t1.

The data processor 40 can be configured to process data obtained by the radiation detector 30, wherein the data processor is configured to determine, calculate or estimate structure orientations of the object utilizing predetermined information, which information contains a relation between a plurality of predetermined structure orientations (expected to be available on patterned objects) and different polarization modes of the measurement beam.

Since an upper surface of the pattern of structures Q1 extends over a predetermined level (i.e. height H1) above a remaining surface part Q2 of the user area, the predetermined level H1 can also be used to provide an accurate pattern height map from the determined surface structure orientations. The pattern height map (relating to the pattern height along a scanning line 45) may be based on both the predetermined height H1 of individual structure parts Q1 in combination with local structure densities and in combination with (respective, local) structure orientations, leading to a highly accurate height map.

The data storage system may be configured to store the detected pattern orientations, for example in addition to detected local pattern densities and/or patterned object identification information.

The levelling information generator (i.e. processor 40) may generate levelling information utilizing the detected orientations of the structures present on the user area UA of the patterned object MA, and the levelling system positions the level of the patterned object based on the thus provided levelling information.

Embodiments described herein may provide a system and method for accurate characterization of a patterned object MA, preferably in-situ (in the lithographic apparatus, when the object is being held by a respective support MT). The embodiments described herein may provide for increasing the number of measurement lanes, at least to measurement lanes 45 that interact with the user area UA (usually containing 'unknown structures' having unknown densities and orientations before loading the patterned object into the lithographic apparatus), so that the accuracy of the patterned object height map may be increased considerably.

For example, as follows from the above, to determine only the reflection coefficient, application of a photodetector as radiation detector 30 can be sufficient. In an embodiment, phase or related polarization properties and reflection intensity of the reflected measurement beam part may be detected, for example by a polarimeter or detector/filter assembly 15, 30. For example, embodiments described herein may provide an accurate measuring of a flatness of the patterned object MA, and correct (for) the flatness in case the object is deformed.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

For example, according to non-limiting embodiments, the measurement system can be configured to detect the orientation of only one structure, or to detect the orientation of each of a plurality of structures, present on the user area of the patterned object.

What is claimed is:

1. A lithographic apparatus configured to project a patterned radiation beam onto a substrate, comprising:
   a support configured to hold a patterned object;
   a measurement system configured to detect orientations or densities or both the orientations and densities of user area structures that are present on a user area of the patterned object;
   a levelling information system configured to generate levelling information by utilizing the detected orientations or densities or both the orientations and densities of the user area structures; and
   a levelling system configured to position a level of the patterned object based on the levelling information.

2. The apparatus according to claim 1, wherein the measurement system is configured to discern or determine spatial orientations of the user area structures, in a 2-dimensional plane, or angular orientations of the user area structures, in a 2-dimensional plane, or general shapes of the user area structures, in a 2-dimensional plane, or any combination thereof.

3. The apparatus according to claim 1, wherein the measurement system is configured to determine the orientations of the user area structures with respect to two orthogonal directions, the two orthogonal directions both being parallel to a radiation receiving surface of the patterned object.

4. The apparatus according to claim 1, wherein the measurement system is configured to scan a measurement beam along at least one scanning line over the user area of the patterned object.

5. The apparatus according to claim 4, wherein the patterned object comprises a marker area located outside the user area, wherein the marker area comprises a marker, and wherein the measurement system is configured to scan the measurement beam over the user area of the patterned object as well as over the marker of the marker area.

6. The apparatus according to claim 1, wherein the measurement system comprises a beam splitter configured to redirect part of a measurement beam that emanates from the patterned object, towards a radiation detector.

7. The apparatus according to claim 1, further comprising
   a polarizing filter configured to filter a predetermined polarization mode of a measurement beam part that emanates from the patterned object; and
   a radiation detector configured to detect radiation filtered by the polarizing filter.

8. The apparatus according to claim 7, further comprising a data processor configured to process data obtained by the radiation detector, wherein the data processor is configured to determine, calculate or estimate structure orientations of the patterned object by utilizing predetermined information that contains a relation between at least two predetermined structure orientations and at least two different polarization modes of the measurement beam.

9. The apparatus according to claim 1, further comprising a data storage system configured to process and store the orientations or densities or both the orientations and densities of the user area structures, detected by the measurement system, in combination with patterned object identification information.

10. A lithographic apparatus configured to project a patterned radiation beam onto a substrate, comprising:
    a support configured to hold a patterned object, the patterned object having a patterned user area;
    a levelling information system configured to provide levelling information that is based on orientations or densities or both the orientations and densities of user area structures present on the user area of the patterned object; and a levelling system configured to receive the levelling information from the levelling information system, and to use the received levelling information for levelling the patterned object.

11. A method for levelling a patterned object, comprising:
detecting an orientation or density or both the orientation and density of one or more user area structures present on a user area of the patterned object;
generating levelling information based on the detected orientation or density or both the orientation and density of the structures; and
levelling the patterned object by utilizing the levelling information.

12. The method according to claim 11, further comprising illuminating at least part of the patterned object with a measuring beam that optically interacts with the user area structure; and
utilizing part of the measuring beam emanating from the patterned object to discern or determine a spatial orientations of the user area structure, or an angular orientation of the user area structure, or a general shape of the user area structure, or any combination thereof, a or utilizing part of the measuring beam emanating from the patterned object to discern or determine the density of the user area structure or utilizing both the part of the measuring beam emanating from the patterned object to discern or determine the spatial orientations of the user area structure, or the angular orientation of the user area structure, or the general shape of the user area structure, or any combination thereof, and the part of the measuring beam emanating from the patterned object to discern or determine the density of the user area structure.

13. The method according to claim 11, wherein the measuring beam is scanned along a predetermined scanning line over the patterned object to illuminate a measuring field of the user area of the patterned object, and wherein the measuring field contains a pattern of structures having certain spatial orientations, angular orientations, general shapes, and densities, respectively, with respect to the scanning line.

14. The method according to claim 11, further comprising filtering a predetermined polarization part of a measuring beam part, emanating from the patterned object; and
detecting the filtered measuring beam part.

15. The method according to claim 14, further comprising providing predetermined information that contains a relation between at least two predetermined structure orientations and at least two different polarization modes of the measurement beam;
processing data obtained from the detection of the filtered measuring beam part; and
determining structure orientations of the patterned object by utilizing the predetermined information.

16. The method according to claim 15, wherein said determining comprises calculating the structure orientations.

17. The method according to claim 15, wherein said determining comprises estimating the structure orientations.

18. The method according to claim 11, further comprising scanning the measurement beam along at least one scanning line over the user area of the patterned object as well as over at least one marker of a marker area located outside the user area of the patterned object.

19. The method according to claim 11, further comprising splitting a measurement beam part that emanates from the patterned object towards a radiation detector.

20. The method according to claim 11, further comprising storing detected orientations or densities or both the orientations and densities of structures present on the user area of a patterned object, detected by the measurement system, in combination with patterned object identification information.

21. The method according to claim 11, wherein at least one of the structures has a width smaller than 100 nm, measured in a direction perpendicular to a levelling direction.

22. A lithographic projection method, including:
providing a radiation beam of radiation having a first wavelength;
providing a patterning device containing a user area having a pattern of structures, the structures having a first reflectivity for the radiation and user area parts extending outside the structures having a second reflectivity for the radiation, the second reflectivity being different from the first reflectivity;
directing the radiation beam onto the user area of the patterning device to impart the pattern of the user area to the radiation beam;
projecting the patterned radiation beam onto a target portion of a substrate with a projection system; and
levelling of at least one of the patterning device and the substrate with respect to the projection system, so that an object plane provided by the patterning device is projected in focus by the projection system onto the substrate, wherein the levelling comprises utilizing a predetermined relation between one or both of orientations and local densities of surface structures and the effect of the one or both of the surface structure orientations and densities on reflection of different polarization parts of incoming radiation.

* * * * *